United States Patent
Masui et al.

(10) Patent No.: US 10,937,919 B2
(45) Date of Patent: Mar. 2, 2021

(54) LIGHT RECEIVING ELEMENT, OPTICAL COMMUNICATION DEVICE, AND METHOD FOR MANUFACTURING A LIGHT RECEIVING ELEMENT

(71) Applicant: Sony Corporation, Tokyo (JP)

(72) Inventors: Yuji Masui, Miyagi (JP); Shingo Kaneko, Miyagi (JP)

(73) Assignee: Sony Corporation, Tokyo (JP)

( * ) Notice: Subject to any disclaimer, the term of this patent is extended or adjusted under 35 U.S.C. 154(b) by 141 days.

(21) Appl. No.: 16/301,363

(22) PCT Filed: Feb. 21, 2017

(86) PCT No.: PCT/JP2017/006257
§ 371 (c)(1),
(2) Date: Nov. 13, 2018

(87) PCT Pub. No.: WO2017/199501
PCT Pub. Date: Nov. 23, 2017

(65) Prior Publication Data
US 2019/0198700 A1    Jun. 27, 2019

(30) Foreign Application Priority Data
May 16, 2016  (JP) ............................. JP2016-097799

(51) Int. Cl.
*H01L 31/105* (2006.01)
*H01L 31/0232* (2014.01)
(Continued)

(52) U.S. Cl.
CPC ...... *H01L 31/105* (2013.01); *H01L 31/03046* (2013.01); *H01L 31/035281* (2013.01);
(Continued)

(58) Field of Classification Search
None
See application file for complete search history.

(56) References Cited

U.S. PATENT DOCUMENTS 5,253,264 A * 10/1993 Suzuki ................... B82Y 20/00
                                                      372/45.012
5,516,723 A *  5/1996 Sasaki .................. H01L 33/145
                                                      257/E33.067
(Continued)

FOREIGN PATENT DOCUMENTS

JP    2002-289905       10/2002
JP    2002-289905 A     10/2002
(Continued)

OTHER PUBLICATIONS

International Search Report and Written Opinion issued in connection with International Patent Application No. PCT/JP2017/006257, dated May 16, 2017. (13 pages).
(Continued)

*Primary Examiner* — Hrayr A Sayadian
(74) *Attorney, Agent, or Firm* — K&L Gates LLP

(57) ABSTRACT

A light receiving element (1) according to an embodiment of the disclosure includes a semiconductor layer (20) in which a photodiode having a PIN structure is provided in a mesa portion having a pillar shape. The photodiode includes a first conductive layer (21), an optical absorption layer (23), and a second conductive layer (24) having a light incident surface. In the light receiving element (1), the semiconductor layer (20) includes, in the vicinity of an interface between the first conductive layer (21) and the optical absorption layer (23), a constricted portion (26) that is the most constricted of the first conductive layer (21). The interface has an end exposed on an internal surface of the constricted portion (26).

14 Claims, 14 Drawing Sheets

(51) Int. Cl.
*H01L 31/18* (2006.01)
*H01L 31/14* (2006.01)
*H01L 31/0304* (2006.01)
*H01L 31/0352* (2006.01)
*H01L 31/103* (2006.01)
*H01L 31/0224* (2006.01)
*H01L 31/173* (2006.01)

(52) U.S. Cl.
CPC ........ *H01L 31/1035* (2013.01); *H01L 31/145* (2013.01); *H01L 31/184* (2013.01); *H01L 31/1844* (2013.01); *H01L 31/022408* (2013.01); *H01L 31/173* (2013.01)

(56) References Cited

U.S. PATENT DOCUMENTS

| | | | |
|---|---|---|---|
| 5,550,081 A * | 8/1996 | Holonyak, Jr. | H01S 5/16 438/33 |
| 2003/0194827 A1 | 10/2003 | Lentz et al. | |
| 2005/0031354 A1 * | 2/2005 | Ohashi | G02B 6/0288 398/141 |
| 2006/0186420 A1 * | 8/2006 | Hirukawa | B82Y 20/00 257/82 |
| 2008/0237452 A1 | 10/2008 | Yoneda et al. | |
| 2009/0194837 A1 | 8/2009 | Yamauchi et al. | |

FOREIGN PATENT DOCUMENTS

| | | |
|---|---|---|
| JP | 2003-046110 | 2/2003 |
| JP | 2003-046110 A | 2/2003 |
| JP | 2005-260118 | 9/2005 |
| JP | 2005-260118 A | 9/2005 |
| JP | 2008-244368 | 10/2008 |
| JP | 2008-244368 A | 10/2008 |
| JP | 2009-188171 | 8/2009 |
| JP | 2009-188171 A | 8/2009 |

OTHER PUBLICATIONS

Shi Jin-Wei et al., GaAs/In0.5Ga0.5P Laser Power Converter With Undercut Mesa for Simultaneous High-Speed Data Detection and DC Electrical Power Generation, IEEE Electron Device Letters, vol. 33, No. 4, Apr. 2012, pp. 561-563. (3 pages).

* cited by examiner

[ FIG. 1 ]
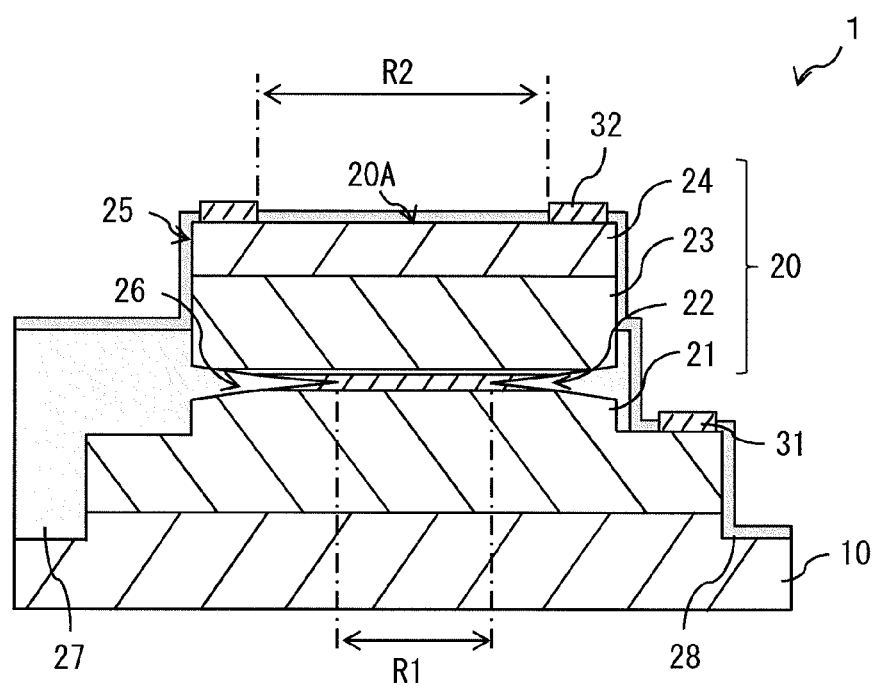
[ FIG. 2 ]
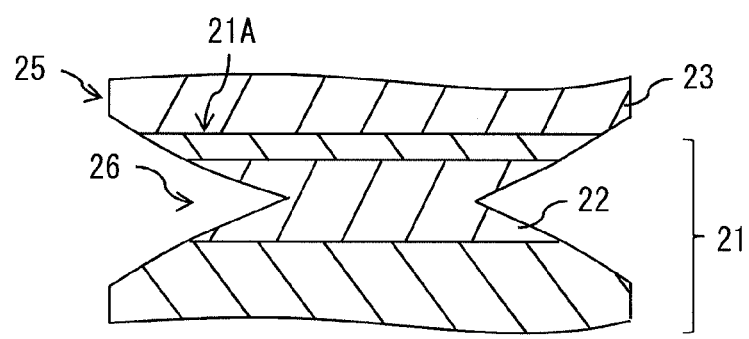

[ FIG. 3 ]
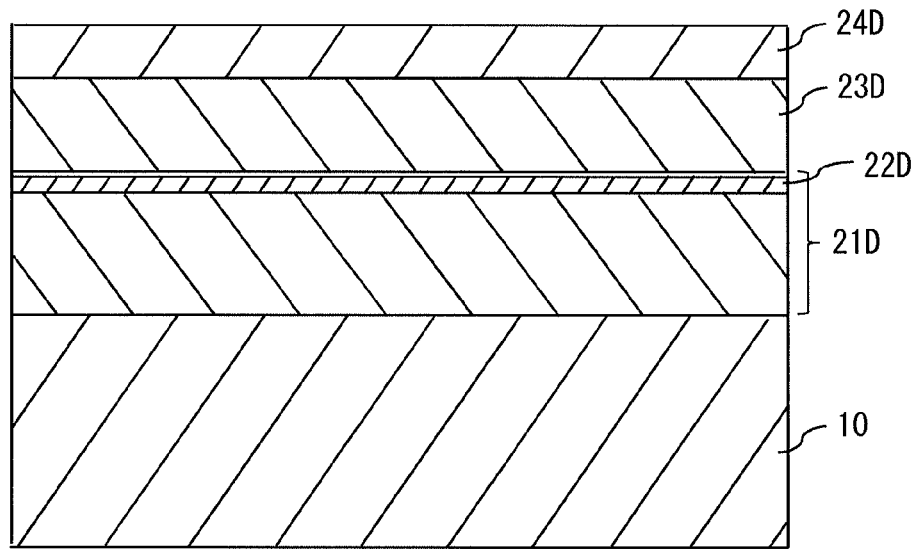
[ FIG. 4 ]
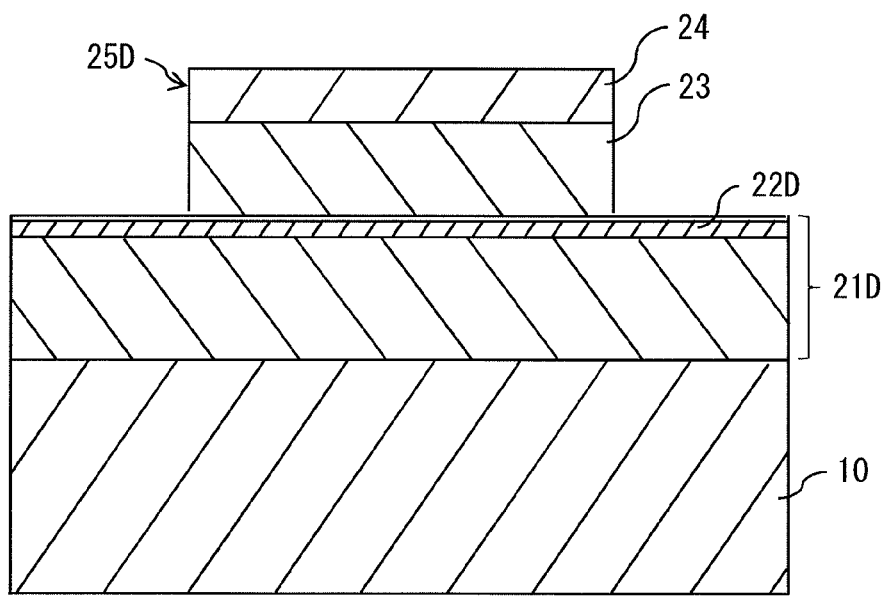

[ FIG. 5 ]
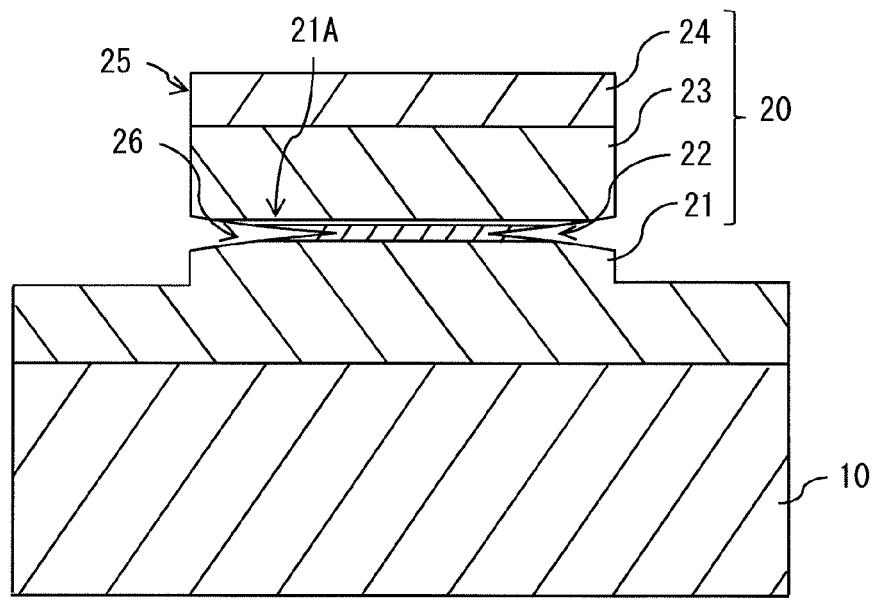
[ FIG. 6 ]
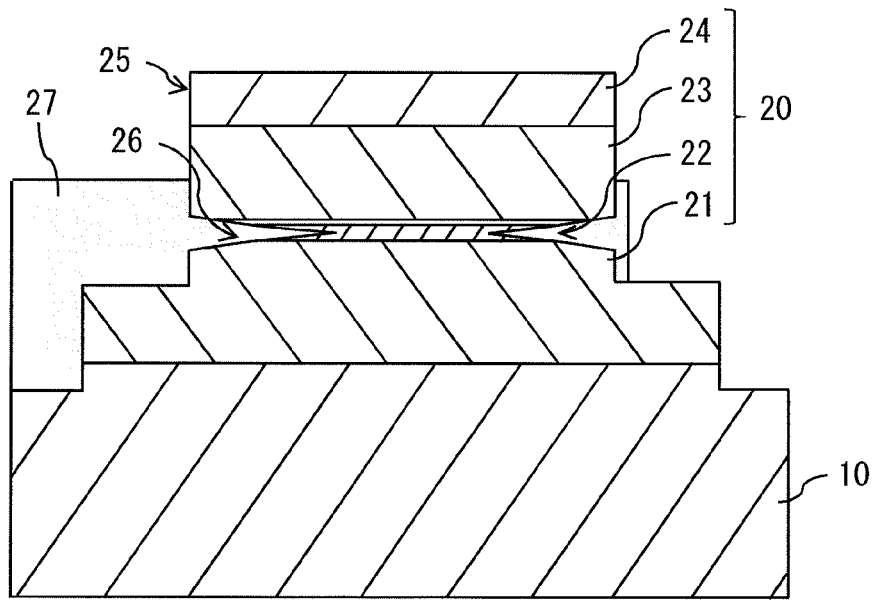

[ FIG. 7 ]
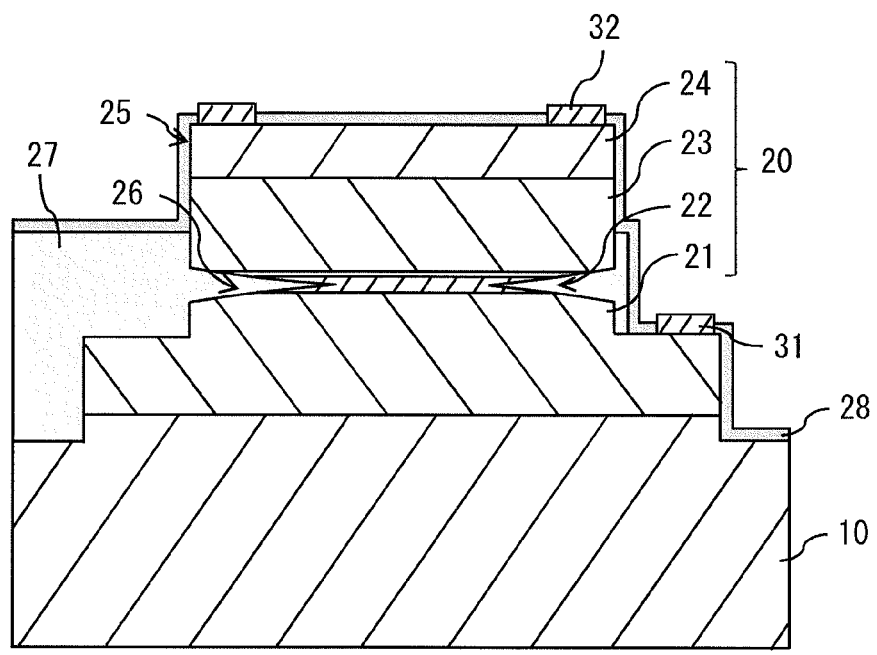
[ FIG. 8 ]
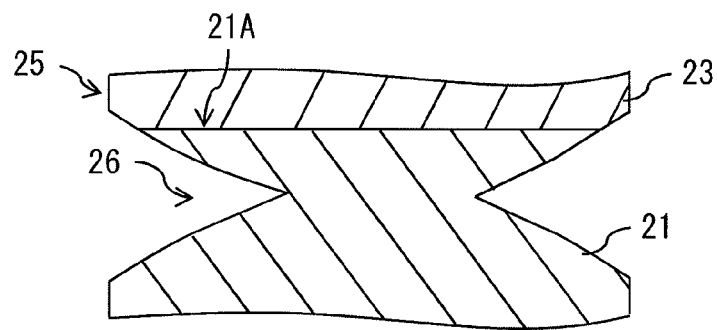

[ FIG. 9 ]
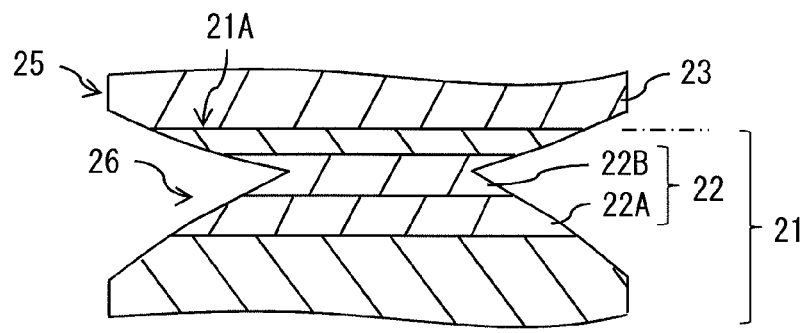
[ FIG. 10 ]
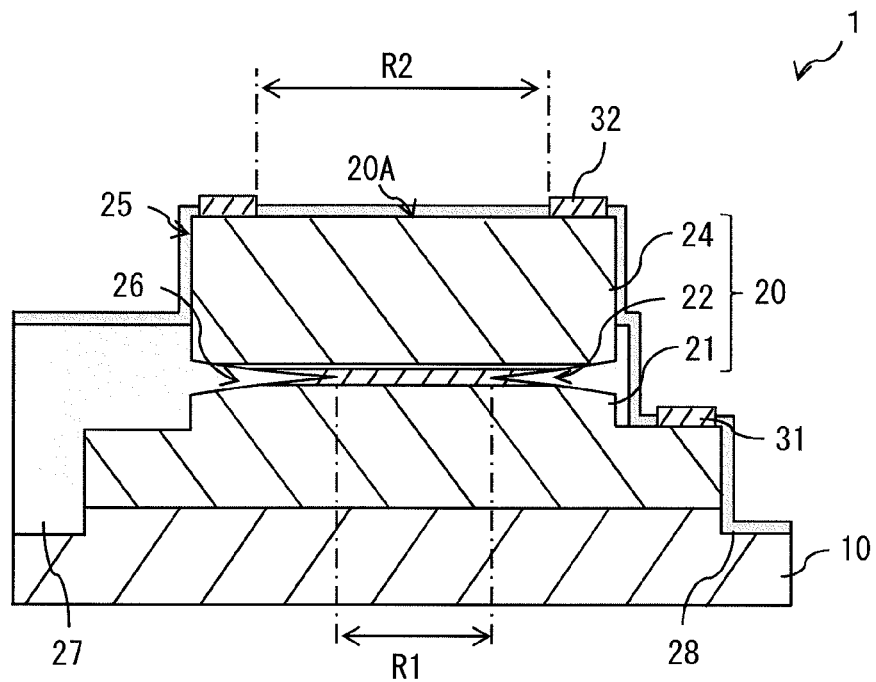

[ FIG. 11 ]
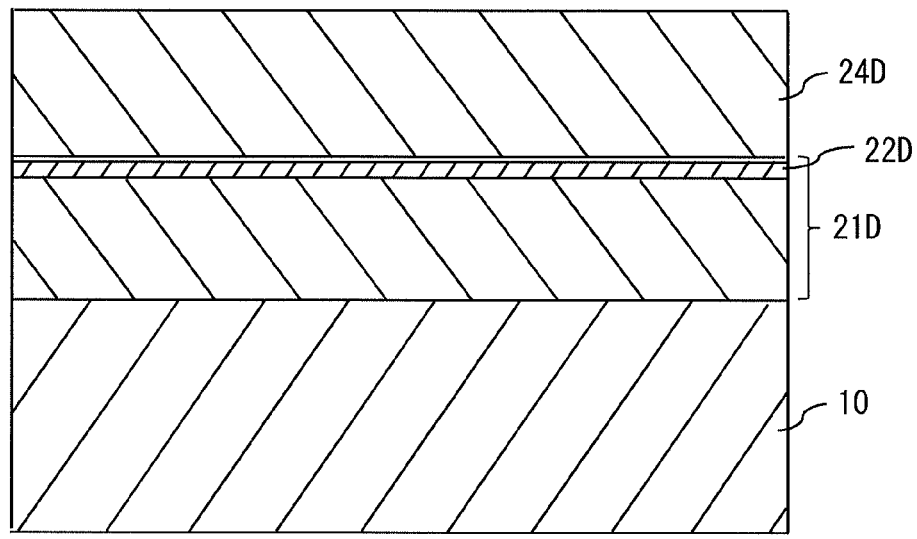
[ FIG. 12 ]
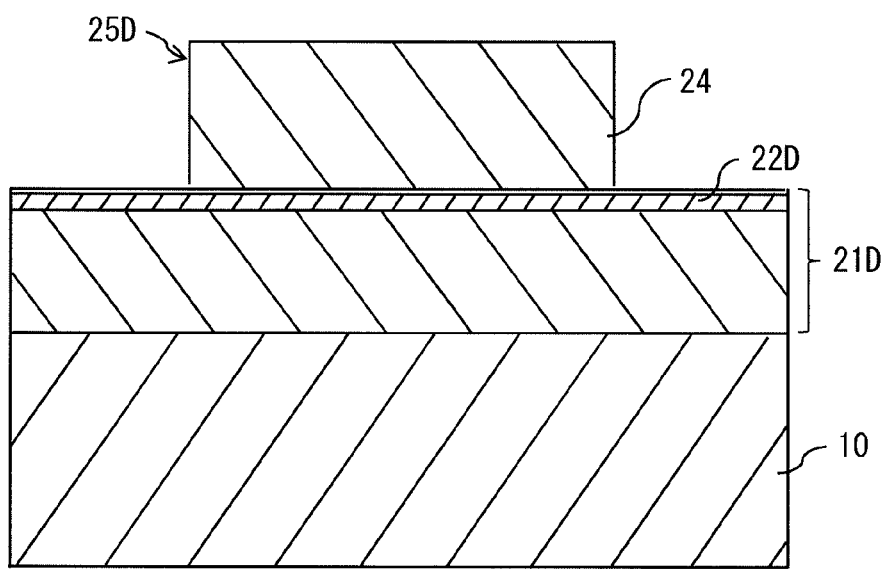

[ FIG. 13 ]
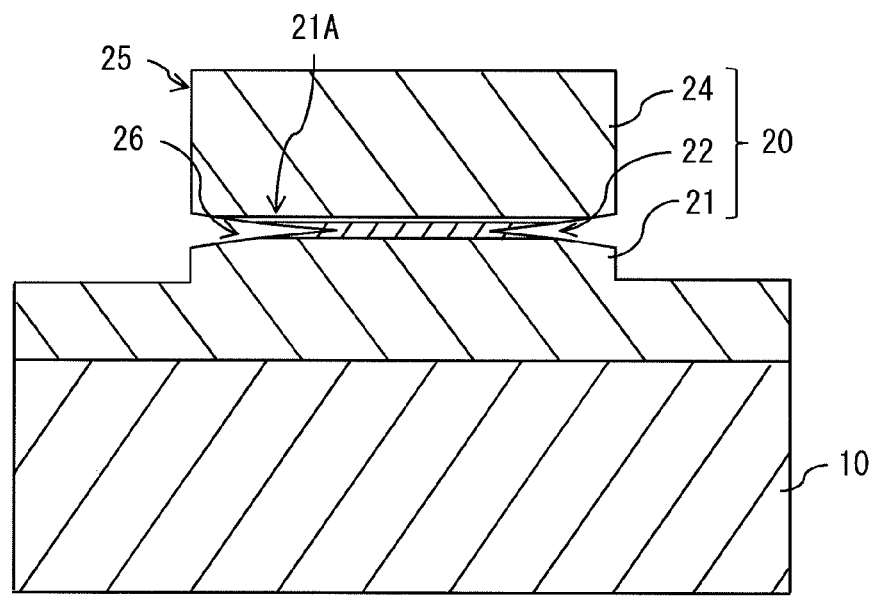
[ FIG. 14 ]
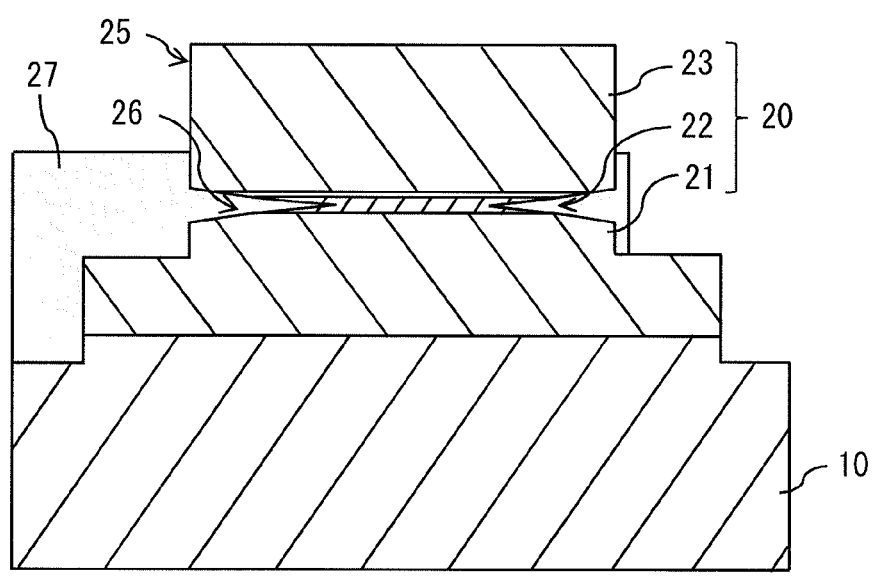

[ FIG. 15 ]
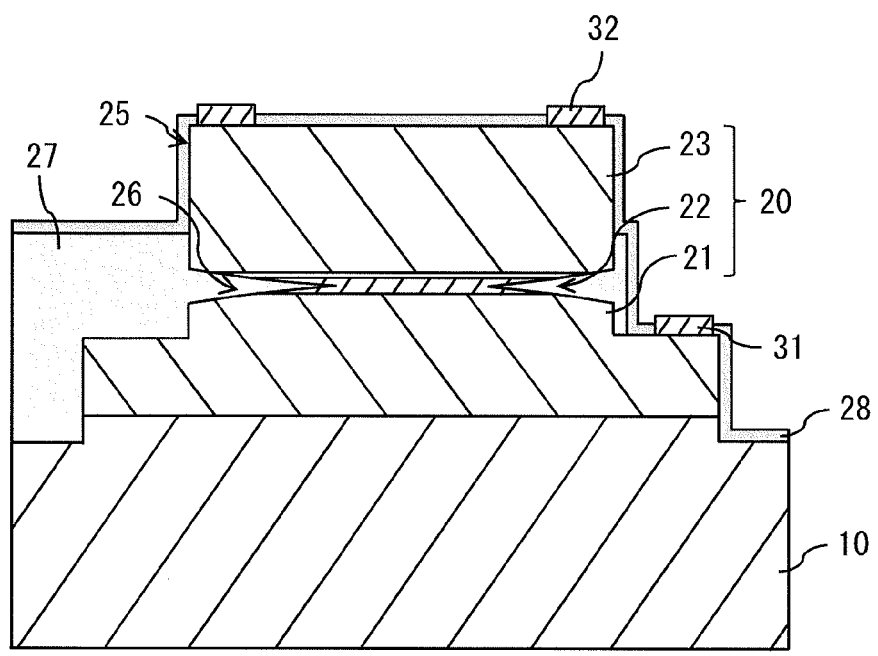

[ FIG. 16 ]
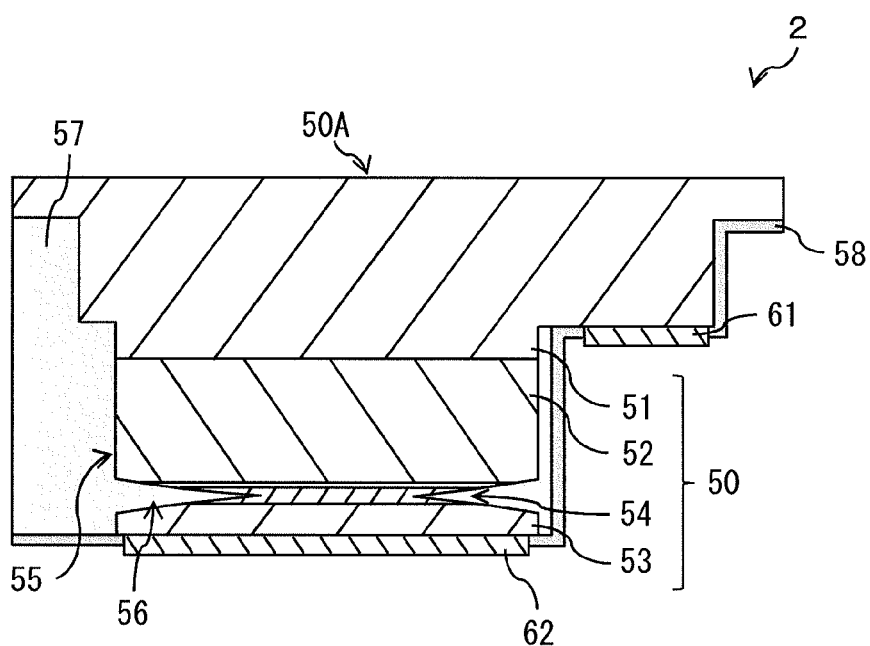
[ FIG. 17 ]
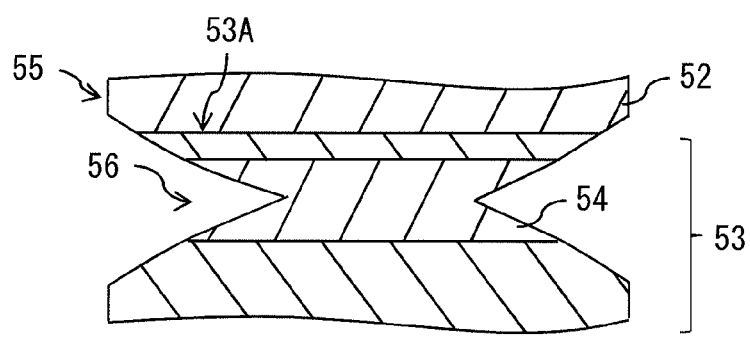

[ FIG. 18 ]
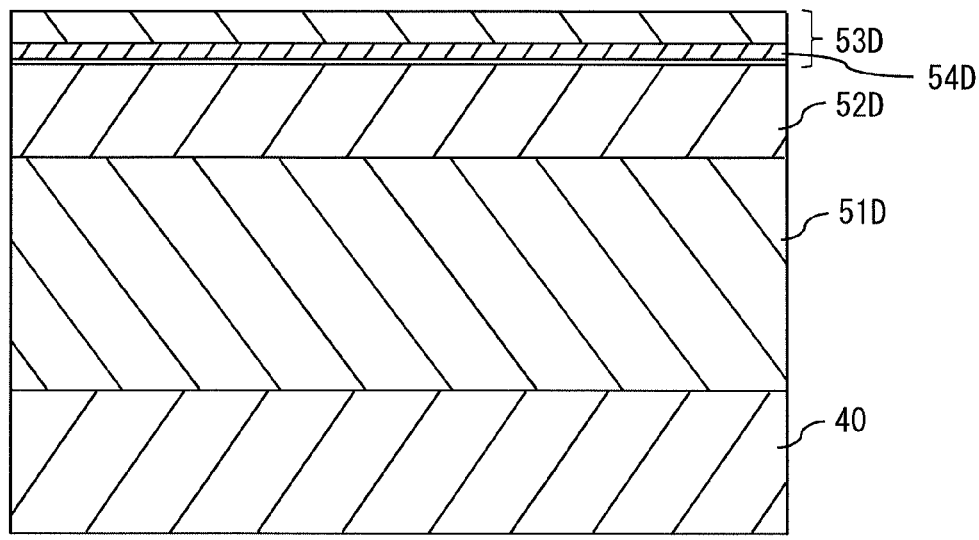
[ FIG. 19 ]
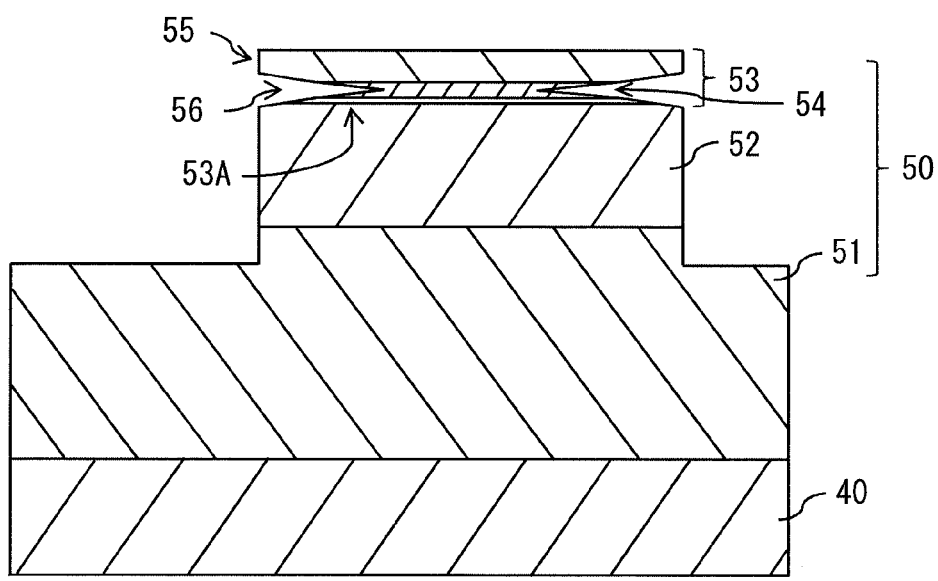

[ FIG. 20 ]
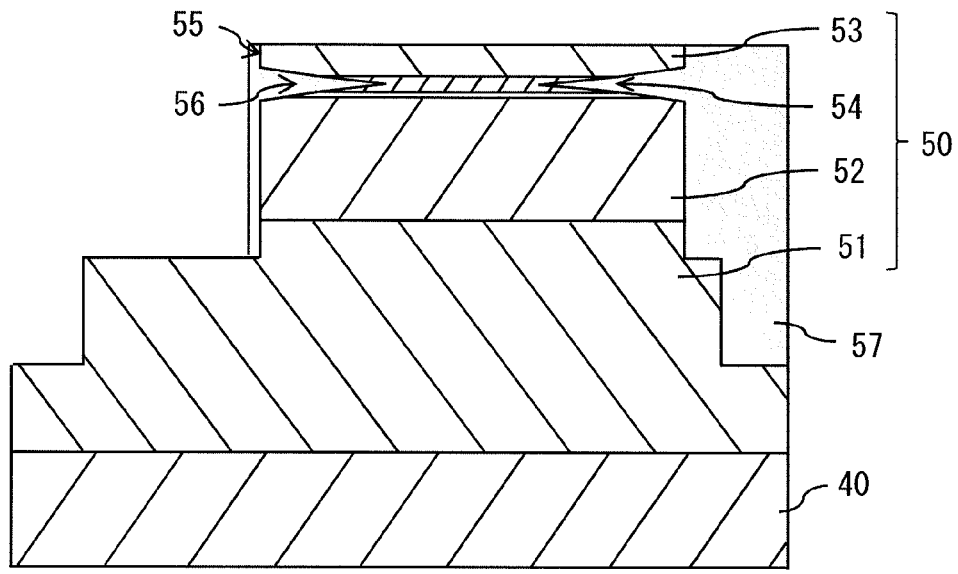
[ FIG. 21 ]
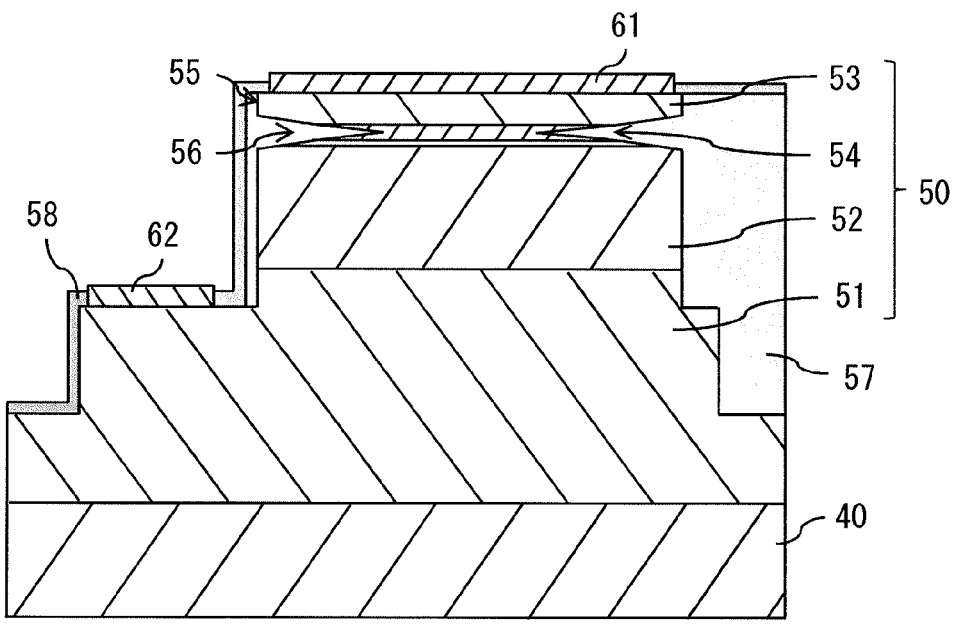

[ FIG. 22 ]
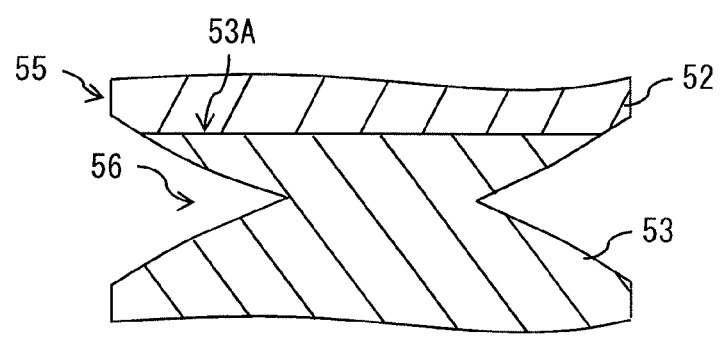
[ FIG. 23 ]
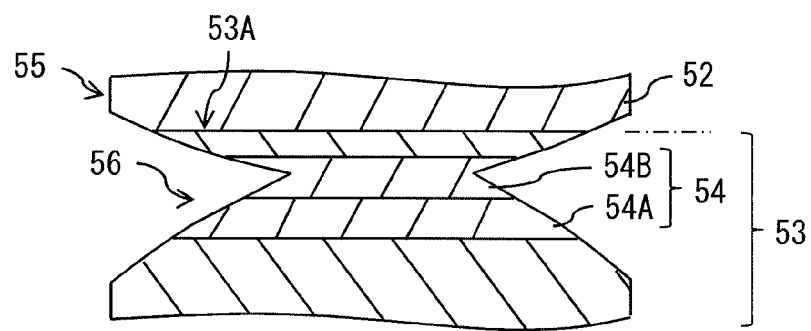

[ FIG. 24 ]
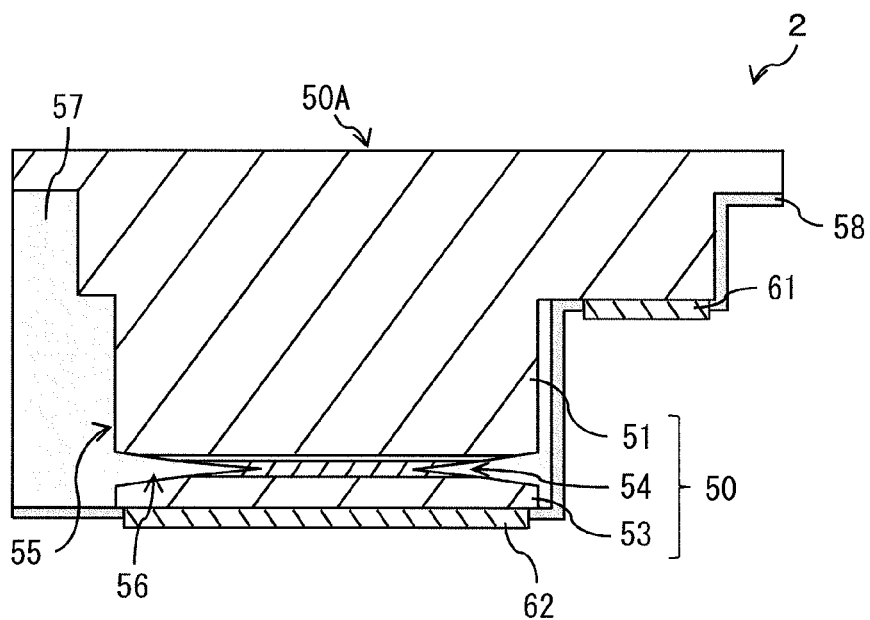

[ FIG. 25 ]
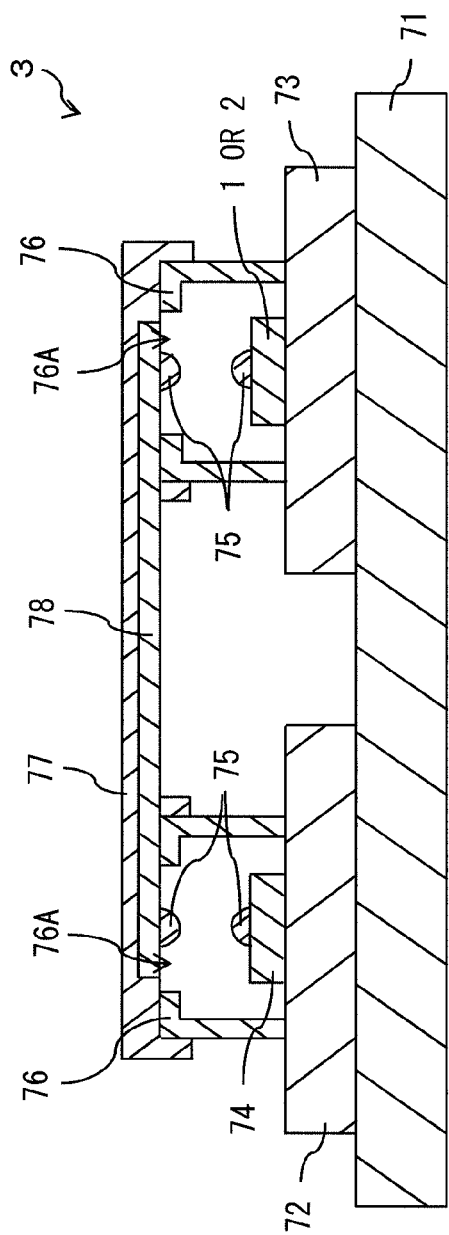

LIGHT RECEIVING ELEMENT, OPTICAL COMMUNICATION DEVICE, AND METHOD FOR MANUFACTURING A LIGHT RECEIVING ELEMENT

CROSS-REFERENCE TO RELATED APPLICATIONS

The present application claims the benefit of International Application No. PCT/JP2017/006257, filed Feb. 21, 2017, which claims priority to Japanese Application No. 2016-097799, filed May 16, 2016, the disclosures of which are incorporated herein by reference.

BACKGROUND

The disclosure relates to a light receiving element, an optical communication device, and a method for manufacturing a light receiving element.

As a light receiving element for optical communication, a mesa-type P-Intrinsic-N (PIN) photodiode is known, for example (See PTL1, for example).

SUMMARY

A light receiving element for optical communication needs to balance mountability and high-speed responsiveness. It is desirable to provide a light receiving element, an optical communication device, and a method for manufacturing a light receiving element that are able to balance mountability and high-speed responsiveness.

A first light receiving element according to an embodiment of the disclosure includes a semiconductor layer in which a photodiode is provided in a mesa portion having a pillar shape. The photodiode has a PIN structure that includes a first conductive layer, an optical absorption layer, and a second conductive layer having a light incident surface. In the first light receiving element, the semiconductor layer includes, in the vicinity of an interface between the first conductive layer and the optical absorption layer, a constricted portion that is the most constricted part of the first conductive layer. The interface has an edge exposed on an internal surface of the constricted portion.

A first optical communication device according to an embodiment of the disclosure includes one or more light receiving elements. The one or more light receiving elements each provided in the first optical communication device has the same components as the first light receiving element as described above.

A method for manufacturing the first light receiving element according to the embodiment of the disclosure includes the following process:
(1) A process of etching a semiconductor layer into a shape of a mesa, in which the semiconductor layer includes a photodiode having a PIN structure that includes a first conductive layer, an optical absorption layer, and a second conductive layer, providing, in the vicinity of an interface between the first conductive layer and the optical absorption layer in the mesa, a constricted portion that is the most constricted part of the first conductive layer, and exposing an edge of the interface to the internal surface of the constricted portion.

In the first light receiving element, the first optical communication device, and the method for manufacturing the first light receiving element according to the embodiment of the disclosure, the mesa portion includes, in the vicinity of the interface between the first conductive layer and the optical absorption layer, a constricted portion that is the most constricted part of the first conductive layer. The interface has an edge exposed on the internal surface of the constricted portion. This allows an element to have a smaller capacitance compared to the case where the constricted portion is not provided in the mesa portion. In addition, even in the case of a larger mesa diameter, it is possible to suppress an increase in the parasitic capacitance of the element.

A second light receiving element according to an embodiment of the disclosure includes a semiconductor layer in which a photodiode is provided in a mesa portion having a pillar shape. The photodiode has a PN structure that includes a first conductive layer and a second conductive layer having a light incident surface. In the second light receiving element, the semiconductor layer includes, in the vicinity of the interface between the first conductive layer and the second conductive layer, a constricted portion that is the most constricted part of the first conductive layer. The interface has an edge exposed on the internal surface of the constricted portion.

The second optical communication device according to the embodiment of the disclosure includes one or more light receiving elements. The one or more light receiving elements each provided in the second optical communication device has the same components as those of the second light receiving element as described above.

A method for manufacturing the second light receiving element according to the embodiment of the disclosure includes the following process:
(1) A process of etching a semiconductor layer into a shape of a mesa, in which the semiconductor layer including a P-type photodiode that includes a first conductive layer and a second conductive layer, providing, in a vicinity of an interface between the first conductive layer and the second conductive layer in the mesa, a constricted portion that is the most constricted part of the first conductive layer, and exposing an edge of the interface to the internal surface of the constricted portion.

In the second light receiving element, the second optical communication device, and the method for manufacturing the second light receiving element according to the embodiment of the disclosure, the mesa portion includes, in the vicinity of an interface between the first conductive layer and the second conductive layer, the constricted portion that is the most constricted part of the first conductive layer. The interface has an edge exposed on the internal surface of the constricted portion. This allows an element to have a smaller capacitance compared to the case where the constricted portion is not provided in the mesa portion. In addition, even in the case of a larger mesa diameter, it is possible to suppress an increase in the parasitic capacitance of the element.

In the first light receiving element, the first optical communication device, and the method for manufacturing the first light receiving element according to the embodiment of the disclosure, the mesa portion includes, in the vicinity of an interface between the first conductive layer and the optical absorption layer, the constricted portion that is the most constricted part of the first conductive layer. At the same time, the interface has an edge exposed on the internal surface of the constricted portion. This makes it possible to balance mountability and high-speed responsiveness.

In the second light receiving element, the second optical communication device, and the method for manufacturing the second light receiving element according to the embodiment of the disclosure, the mesa portion includes, in the vicinity of an interface between the first conductive layer and the second conductive layer, the constricted portion that is the most constricted part of the the first conductive layer. At the same time, the interface has an edge exposed on the internal surface of the constricted portion. This makes it possible to balance mountability and high-speed responsiveness.

It is to be noted that the effects described here are not necessarily limitative, and may have any of the effects described in the disclosure

BRIEF DESCRIPTION OF DRAWINGS

FIG. 1 is a diagram illustrating an example of a cross-sectional configuration of a light receiving element according to a first embodiment of the disclosure.

FIG. 2 is an enlarged view illustrating an example of a cross-sectional configuration in the vicinity of a constriction-formed layer in FIG. 1.

FIG. 3 is a diagram illustrating an example of a manufacturing process of the light receiving element in FIG. 1.

FIG. 4 is a diagram illustrating an example of a manufacturing process that follows FIG. 3.

FIG. 5 is a diagram illustrating an example of a manufacturing process that follows FIG. 4.

FIG. 6 is a diagram illustrating an example of a manufacturing process that follows FIG. 5.

FIG. 7 is a diagram illustrating an example of a manufacturing process that follows FIG. 6.

FIG. 8 is an enlarged view illustrating a modification example of the cross-sectional configuration in the vicinity of the constriction-formed layer in FIG. 2.

FIG. 9 is an enlarged view illustrating a modification example of the cross-sectional configuration in the vicinity of the constriction-formed layer in FIG. 2.

FIG. 10 is a diagram illustrating a modification example of the cross-sectional configuration of the light receiving element in FIG. 1.

FIG. 11 is a diagram illustrating an example of a manufacturing process of the light receiving element in FIG. 10.

FIG. 12 is a diagram illustrating an example of a manufacturing process that follows FIG. 11.

FIG. 13 is a diagram illustrating an example of a manufacturing process that follows FIG. 12.

FIG. 14 is a diagram illustrating an example of a manufacturing process that follows FIG. 13.

FIG. 15 is a diagram illustrating an example of a manufacturing process that follows FIG. 14.

FIG. 16 is a diagram illustrating an example of a cross-sectional configuration of a light receiving element according to a second embodiment of the disclosure.

FIG. 17 is an enlarged view illustrating an example of a cross-sectional configuration in the vicinity of the constriction-formed layer in FIG. 16.

FIG. 18 is a diagram illustrating an example of a manufacturing process of the light receiving element in FIG. 16.

FIG. 19 is a diagram illustrating an example of a manufacturing process that follows FIG. 18.

FIG. 20 is a diagram illustrating an example of a manufacturing process that follows FIG. 19.

FIG. 21 is a diagram illustrating an example of a manufacturing process that follows FIG. 20.

FIG. 22 is an enlarged view illustrating a modification example of the cross-sectional configuration in the vicinity of the constriction-formed layer in FIG. 17.

FIG. 23 is an enlarged view illustrating a modification example of the cross-sectional configuration in the vicinity of the constriction-formed layer in FIG. 17.

FIG. 24 is a modification example of the cross-sectional configuration of the light receiving element in FIG. 16.

FIG. 25 is a diagram illustrating an example of a cross-sectional configuration of an optical communication device according to a third embodiment of the disclosure.

DETAILED DESCRIPTION

In the following, some embodiments of the disclosure are described in detail with reference to the drawings. The following description is a specific example of the disclosure, and the disclosure is not limited by the following embodiments. In addition, the disclosure is not limited by position, dimension, proportion, etc., either. It is to be noted that descriptions are given in the following order:
1. First Embodiment (light receiving element)
Example in which a constricted portion is provided in a light receiving element of an upper surface incident type
2. Modification Examples of the First Embodiment (light receiving element)
Example in which the constriction-formed layer is omitted
Example in which the constriction-formed layer includes more than one layer
Example in which the optical absorption layer is omitted
Variation of etchant
3. Second Embodiment (light receiving element)
Example in which a constricted portion is provided in a light receiving element of a rear surface incident type
4. Modification Examples of the Second Embodiment (light receiving element)
Example in which the constriction-formed layer is omitted
Example in which the constriction-formed layer includes more than one layer
Example in which the optical absorption layer is omitted
Variation of etchant
5. Modification Examples of the Third Embodiment (optical communication device)
Example in which the light receiving element according to any of the foregoing embodiments and modification examples is provided in the optical communication device 1. First Embodiment

[Configuration]

A configuration of a light receiving element 1 according to a first embodiment of the disclosure is described. FIG. 1 illustrates an example of a cross-sectional configuration of the light receiving element 1 according to the present embodiment. The light receiving element 1 is preferably applicable to an optical communication device that performs signal transmission (optical transmission) between semiconductor chips such as LSIs. The light receiving element 1 is a light receiving element of an upper surface incident type, and includes, for example, a semiconductor layer 20 on a substrate 10. The substrate 10 includes, for example, an undoped GaAs substrate. The semiconductor layer 20 has a device structure in which, for example, a first conductive layer 21, an optical absorption layer 23, and a second conductive layer 24 are laminated in this order, starting from a side of the substrate 10.

The first conductive layer 21 (specifically, an upper portion of the first conductive layer 21), the optical absorption layer 23, and the second conductive layer 24 constitute a mesa portion 25 having a pillar shape. For example, the pillar-shaped mesa portion 25 has a shape of a cylinder that extends in a normal direction of the substrate 10. The pillar-shaped mesa portion 25 have a side surface that is parallel to the normal direction of the substrate 10, or that has a forward tapered shape or a reverse tapered shape. An upper surface of the second conductive layer 24 (a surface, of the second conductive layer 24, located on an opposite side of the optical absorption layer 23) is included in an upper surface of the mesa portion 25, and is a light incident surface 20A through which light enters from outside.

Each of the first conductive layer 21 and the second conductive layer 24 includes a semiconductor material of a conductivity type different from each other. The first conductive layer 21 includes, for example, n-type AlGaAs. As an n-type impurity included in the n-type GaAs, silicon (Si) or selenium (Se) is given, for example. The second conductive layer 24 includes, for example, p-type AlGaAs. As a p-type impurity included in the p-type AlGaAs, zinc (Zn), magnesium (Mg), and beryllium (Be) are given.

The optical absorption layer 23 absorbs the light entering the light incident surface 20A, and converts the absorbed light into an electrical signal (photocurrent) corresponding to an output level of the absorbed light. For example, the optical absorption layer 23 includes undoped GaAs or undoped InGaAs. There is provided, in the pillar-shaped mesa portion 25 in the semiconductor layer 20, a photodiode having a PIN structure that includes the first conductive layer 21 (specifically, the upper portion of the first conductive layer 21), the optical absorption layer 23, and the second conductive layer 24. In other words, the light receiving element 1 includes a mesa-type PIN photodiode. It is to be noted that the electrical signal generated in the optical absorption layer 23 is inputted, as an optical communication signal, into an optical communication calculation circuit (not illustrated) coupled to a first electrode 31 and a second electrode 32 that are described later. The optical communication signal is used in the optical communication calculation circuit for determining a signal level of the light that has entered the light incident surface 20A.

The light receiving element 1 further includes, for example, the first electrode 31 and the second electrode 32. The first electrode 31 is electrically coupled to the first conductive layer 21 and is provided, for example, in contact with a rim of the mesa portion 25 (specifically, a flat surface of the first conductive layer 21). For example, the first electrode 31 has a configuration in which an alloy of gold (Au) and germanium (Ge), nickel (Ni), and gold (Au) are laminated in this order, starting from a side of the first conductive layer 21. The second electrode 32 is electrically coupled to the second conductive layer 24, and is provided, for example, in contact with an upper surface of the second conductive layer 24. For example, the second electrode 32 has an annular shape and has an opening. Of the upper surface of the second conductive layer 24, a portion exposed to an inside of the opening of the second electrode 32 is the light incident surface 20A. The second electrode 32 may have an annular shape without a break, or may have an annular shape with a one or more breaks. The second electrode 32 includes, for example, titanium (Ti), platinum (Pt), and gold (Au) that are laminated in this order, starting from a side of the second conductive layer 24.

Meanwhile, the semiconductor layer 20 includes, in the vicinity of the interface 21A between the first conductive layer 21 and the optical absorption layer 23, a constricted portion 26 that is the most constricted part of the first conductive layer 21. For example, the constricted portion 26 is rotationally symmetrical with respect to a central axis of the mesa portion 25 as a rotational center (a line segment parallel to an optical axis of the light receiving element 1 and passing through a center of the mesa portion 25). The constricted portion 26 is provided along an outer edge of the mesa portion 25, avoiding at least a part of a region opposing the light incident surface 20A. In other words, the constricted portion 26 is provided in a manner not to interrupt a current path in the semiconductor layer 20.

The constricted portion 26 has a wedge shape tapering toward the central axis of the mesa portion 25, with the interface 21A having an edge exposed on an internal surface of the constricted portion 26. The interface 21A has a smaller area than the interface between the first conductive layer 21 and the optical absorption layer 23 when assuming that the constricted portion 26 is not provided. The narrowest part of the constricted portion 26 has a diameter (constriction diameter R1) smaller than a light reception diameter R2 of the light incident surface 20A. The narrowest part of the constricted portion 26 has a depth (length) of, for example, not less than 2 µm and not more than 20 µm. In a case where the constricted portion 26 has a length smaller than 2 µm, an effect produced by reducing the area of the interface 21A (effect of reducing parasitic capacitance) is very small. In a case where the constricted portion 26 has a length larger than 20 µm, a current path in the semiconductor layer 20 for photoelectrons generated in the vicinity of the side surface of the mesa portion 25 within the optical absorption layer 23 is significantly larger than a current path in the semiconductor layer 20 for photoelectrons generated in the middle of the mesa portion 25 within the optical absorption layer 23. This is likely to cause an adverse impact on high-speed responsiveness.

FIG. 2 is an enlarged view illustrating an example of a cross-sectional configuration in the vicinity of the constricted portion 26. The first conductive layer 21 includes a constriction-formed layer 22 at the narrowest part of the constricted portion 26. The constriction-formed layer 22 includes a material having a relatively high etching rate compared to another part of the first conductive layer 21 except for the constricted portion 26. In a case where the first conductive layer 21 includes n-type AlGaAs, the constriction-formed layer 22 includes, for example, n-type AlAs or n-type AlGaInP. When using, as an etchant, a solution in which phosphoric acid, hydrogen peroxide, and water are mixed at a ratio 3:1:50, AlAs has a higher etching rate than AlGaAs and GaAs. In addition, when using a mixed solution of hydrochloric acid and water as the etchant, AlGaInP has a higher etching rate than AlGaAs and GaAs. In a case where the first conductive layer 21 has a thickness of about 2 µm and the optical absorption layer 23 has a thickness of about 2 µm, the constriction-formed layer 22 has a thickness of not less than 10 nm and not more than 100 nm, for example, and a thickness between the interface 21A and the constriction-formed layer 22 within the first conductive layer 21 is about 100 nm, for example.

The light receiving element 1 further includes, for example, insulative members (buried layer 27 and insulating film 28) that protect the constricted portion 26. The buried layer 27 is provided to bury the constricted portion 26, and includes, for example, a resin material such as polyimide. The insulating film 28 is provided to cover a surface of the buried layer 27 and a surface of the mesa portion 25, and includes an insulative material. As the insulative material used for the insulating film 28, SiO2 and SiN are given, for example.

[Manufacturing Method]

Next, a method for manufacturing the light receiving element 1 according to the present embodiment is described. FIG. 3 illustrates an example of a manufacturing process of the light receiving element 1. FIG. 4 illustrates an example of a manufacturing process that follows FIG. 3. FIG. 5 illustrates an example of a manufacturing process that follows FIG. 4. FIG. 6 illustrates an example of a manufacturing process that follows FIG. 5. FIG. 7 illustrates an example of a manufacturing process that follows FIG. 6.

To manufacture the light receiving element 1, for example, a compound semiconductor is collectively provided on the substrate 10 that includes GaAs, using an epitaxial crystal growth method such as a metal organic chemical vapor deposition (MOCVD: Metal Organic Chemical Vapor Deposition) method. At this time, for example, as a material for the compound semiconductor, methyl-based organometallic gas such as trimethylaluminum (TMAl), trimethylgallium (TMGa), trimethylindium (TMIn), and arshin (AsH3) are used. As a material for donor impurity, hydrogen selenide (H2Se) is used, for example. As a material for acceptor impurity, dimethylzinc (DMZn) is used, for example.

It is to be noted that in FIG. 3, a first conductive layer 21D includes the same material as the first conductive layer 21. A constriction-formed layer 22D includes the same material as the constriction-formed layer 22. An optical absorption layer 23D includes the same material as the optical absorption layer 23. A second conductive layer 24D includes the same material as the second conductive layer 24.

First, as illustrated in FIG. 3, for example, the first conductive layer 21D (for example, n-type AlGaAs), the optical absorption layer 23D (for example, non-doped GaAs), and the second conductive layer 24D (for example, p-type AlGaAs) are provided on the substrate 10 in this order, starting from the side of the substrate 10. At the same time, the constriction-formed layer 22D (for example, n-type AlAs or n-type AlGaInP) is provided in the first conductive layer 21D. Next, for example, a resist layer having a circular shape (not illustrated) is provided, and thereafter the second conductive layer 24D and the optical absorption layer 23D are selectively etched using the resist layer as a mask. At this time, it is preferable to use reactive ion etching (RIE) by Cl-based gas, for example. As illustrated in FIG. 4, for example, this provides, immediately under the resist layer, a mesa portion 25D having a pillar shape with a side surface of each of the second conductive layer 24 and the optical absorption layer 23 being exposed thereon.

Subsequently, the semiconductor layer that includes the first conductive layer 21D, the constriction-formed layer 22D, the optical absorption layer 23, and the second conductive layer 24 is etched into a mesa shape. At this time, wet etching is used. Here, in a case where the constriction-formed layer 22D includes n-type AlAs, a solution in which phosphoric acid, hydrogen peroxide, and water are mixed at a ratio 3:1:50 is used as the etchant. In a case where the constriction-formed layer 22D includes n-type AlGaInP, a solution in which hydrochloric acid and water is mixed is used as the etchant. Thus, as illustrated in FIG. 5, for example, selective etching of the constriction-formed layer 22D forms, in the vicinity of the interface 21A between the first conductive layer 21D and the optical absorption layer 23 in the mesa (mesa portion 25), the constricted portion 26 that is the most constricted part of the first conductive layer 21D, while exposing an edge of the interface 21A to the internal surface of the constricted portion 26. As a result, the mesa portion 25 including the constricted portion 26 in the side surface is provided.

Next, as illustrated in FIG. 6, for example, the buried layer 27 that protects the constricted portion 26 is provided. Subsequently, as illustrated in FIG. 7, for example, the insulating film 28, the first electrode 31, and the second electrode 32 are provided. Finally, for example, the substrate 10 is polished and thereby thinned. In this manner, the light receiving element 1 according to the present embodiment is manufactured.

[Effects]

Next, effects of the light receiving element 1 according to the present embodiment are described.

Generally, the light receiving element for communication needs mountability and high-speed responsiveness. However, mountability and high-speed responsiveness have a trade-off relationship. To increase a displacement tolerance of a fiber, lens, etc. for easier mounting, it is desirable to provide the largest possible light receiving area. In contrast, to increase high-speed responsiveness, it is desirable to provide the smallest possible parasitic capacitance of an element. For a smaller parasitic capacitance of the element, it is necessary to reduce the light receiving area (cross-sectional area of PIN junction).

A general light receiving element includes a ring electrode on the upper surface of the mesa, and thus the cross-sectional area of the PIN junction is specified by the mesa diameter. For a smaller cross-sectional area of the PIN junction, it is necessary to reduce the mesa diameter. However, the smaller the mesa diameter becomes, the smaller the area of an opening (the light receiving area) in the ring electrode becomes.

In contrast, in the present embodiment, the mesa portion 25 includes, in the vicinity of the interface 21A between the first conductive layer 21 and the optical absorption layer 23, the constricted portion 26 that is the most constricted part of the first conductive layer 21. The interface 21A has an edge exposed on the internal surface of the constricted portion 26. This allows for a smaller parasitic capacitance of the element as compared to the case of the mesa portion 25 without the constricted portion 26. In addition, even in the case of a larger mesa diameter, it is possible to suppress an increase in the parasitic capacitance of the element. Thus, it is possible to balance mountability and high-speed responsiveness.

In addition, in the present embodiment, the constriction-formed layer 22 is provided at the narrowest part of the constricted portion 26. The constriction-formed layer 22 includes a material having a relatively high etching rate compared to another part of the first conductive layer 21 except for the constricted portion 26. This makes it possible to easily provide the constricted portion 26, utilizing selective etching by wet etching. Thus, it is possible to balance mountability and high-speed responsiveness in a simple manner.

In addition, in the present embodiment, the narrowest part of the constricted portion 26 has a diameter (constriction diameter R1) smaller than the light reception diameter R2 of the light incident surface 20A. The narrowest part of the constricted portion 26 has a depth (length) of, for example, not less than 2 μm and not more than 20 μm. This makes it possible to balance mountability and high-speed responsiveness.

In addition, in the present embodiment, the insulative member (buried layer 27 or insulating film 28) is provided that protects the constricted portion 26. This makes it possible to suppress deterioration in reliability as a result of providing the constricted portion 26.

2. Modification Examples of the First Embodiment

Next, modification examples of the light receiving element 1 according to the foregoing embodiment are described.

[Modification Example A]

In the foregoing embodiment, as illustrated in FIG. 8, for example, the constriction-formed layer 22 may be omitted, and the constricted portion 26 may be provided in the vicinity of the interface 21A in the semiconductor layer 20. However, in such a case, for example, the constricted portion 26 may be provided in the following manner. For example, in the manufacturing process, a mask having an opening is provided in a region where the constricted portion 26 is to be provided in a mesa-etched side surface of the first conductive layer 21 and the optical absorption layer 23, and thereafter the constricted portion 26 is formed by selectively etching the first conductive layer 21 and the optical absorption layer 23 via the opening in the mask. In the present modification example, as with the foregoing embodiment, it is also possible to balance mountability and high-speed responsiveness.

[Modification Example B]

In any of the foregoing embodiment and modification examples thereof, the constriction-formed layer 22 may include more than one layer. For example, as illustrated in FIG. 9, the constriction-formed layer 22 may be a laminate including two constriction-formed layers 22A and 22B. At this time, the constriction-formed layer 22A is provided closer to the substrate 10, and the constriction-formed layer 22B is provided closer to the optical absorption layer 23. For the same etchant, the constriction-formed layer 22B has a higher etching rate than the constriction-formed layer 22A. Thus, when the constriction-formed layers 22A and 22B are etched using the same etchant, the constriction-formed layer 22B is etched faster than the constriction-formed layer 22A, thus the narrowest part of the constricted portion 26 is provided closer to the optical absorption layer 23 in the constriction-formed layer 22B. As a result, this makes it possible to easily provide the edge of the interface 21A at a position closer to the center of the light receiving element 1. Thus, it is possible not only to balance mountability and high-speed responsiveness, but also to easily achieve high-speed responsiveness.

[Modification Example C]

In any of the foregoing embodiment and modification examples thereof, the optical absorption layer 23 may be omitted. At this time, for example, as illustrated in FIG. 10, there is provided, in the pillar-shaped mesa portion 25 in the semiconductor layer 20, a photodiode having a PN structure that includes the first conductive layer 21 (specifically, the upper portion of the first conductive layer 21) and the second conductive layer 24. In other words, in the present modification example, the light receiving element 1 includes a mesa-type PN photodiode.

In the present modification example, the semiconductor layer 20 includes, in the vicinity of the interface 21A between the first conductive layer 21 and the second conductive layer 24, the constricted portion 26 that is the most constricted part of the first conductive layer 21. The constricted portion 26 has a wedge shape tapering toward the central axis of the mesa portion 25, and the interface 21A has an edge exposed on the internal surface of the constricted portion 26. The interface 21A has a smaller area than the interface between the first conductive layer 21 and the second conductive layer 24 when assuming that the constricted portion 26 is not provided. The narrowest part of the constricted portion 26 has a diameter (constriction diameter R1) smaller than the light reception diameter R2 of the light incident surface 20A. The narrowest part of the constricted portion 26 has a depth (length) of, for example, not less than 2 μm and not more than 20 μm. In a case where the constricted portion 26 has a length smaller than 2 μm, an effect produced by reducing the area of the interface 21A is very small. In a case where the constricted portion 26 has a length larger than 20 μm, within a depletion region that is provided in a region including the interface 21A between the first conductive layer 21 and the second conductive layer 24, a current path in the semiconductor layer 20 for photoelectrons generated in the vicinity of the side surface of the mesa portion 25 is significantly longer than a current path in the semiconductor layer 20 for photoelectrons generated in the middle of the mesa portion 25 within the depletion region. This is likely to have an adverse influence on high-speed responsiveness.

[Manufacturing Method]

Next, a method for manufacturing the light receiving element 1 according to the present modification example is described. FIG. 11 illustrates an example of a manufacturing process of the light receiving element 1 according to the present modification example. FIG. 12 illustrates an example of a manufacturing process that follows FIG. 11. FIG. 13 illustrates an example of a manufacturing process that follows FIG. 12. FIG. 14 illustrates an example of a manufacturing process that follows FIG. 13. FIG. 15 illustrates an example of a manufacturing process that follows FIG. 14.

First, as illustrated in FIG. 11, for example, the first conductive layer 21D (n-type AlGaAs) and the second conductive layer 24D (p-type AlGaAs) are provided on the substrate 10 in this order, starting from the side of the substrate 10. At the same time, the constriction-formed layer 22D (n-type AlAs or n-type AlGaInP)) is provided in the first conductive layer 21D. Next, for example, a resist layer having a circular shape (not illustrated) is provided, and thereafter the second conductive layer 24D is selectively etched using the resist layer as a mask. At this time, it is preferable to use RIE by Cl-based gas, for example. As illustrated in FIG. 12, for example, this provides, immediately under the resist layer, the pillar-shaped mesa portion 25D with a side surface of the second conductive layer 24 being exposed thereon.

Subsequently, the semiconductor layer that includes the first conductive layer 21D, the constriction-formed layer 22D, and the second conductive layer 24 is etched into a mesa shape. At this time, wet etching is used. Here, in a case where the constriction-formed layer 22D includes n-type AlAs, the solution in which phosphoric acid, hydrogen peroxide, and water are mixed at a ratio 3:1:50 is used as the etchant. In a case where the constriction-formed layer 22D includes n-type AlGaInP, the solution in which hydrochloric acid and water is mixed is used as the etchant. Thus, as illustrated in FIG. 13, for example, selective etching of the constriction-formed layer 22D forms, in the vicinity of the interface 21A between the first conductive layer 21D and the second conductive layer 24 in the mesa (mesa portion 25), the constricted portion 26 that is the most constricted part of the first conductive layer 21D, while exposing an edge of the interface 21A to the internal surface of the constricted portion 26. As a result, the mesa portion 25 including the constricted portion 26 in the side surface is provided.

Next, as illustrated in FIG. 14, for example, the buried layer 27 that protects the constricted portion 26 is provided. Subsequently, as illustrated in FIG. 15, for example, the insulating film 28, the first electrode 31, and the second electrode 32 are provided. Finally, for example, the substrate 10 is polished and thereby thinned. In this manner, the light receiving element 1 according to the present modification example is manufactured.

In the present modification example, as with the foregoing embodiment, there is provided, in the vicinity of the interface 21A between first conductive layer 21 and the second conductive layer 24, the constricted portion 26 that is the most constricted part of the first conductive layer 21. This makes it possible to balance mountability and high-speed responsiveness.

In addition, in the present modification example, the constriction-formed layer 22 is provided at the narrowest part of the constricted portion 26. The constriction-formed layer 22 includes a material having a relatively high etching rate compared to another part of the first conductive layer 21 except for the constricted portion 26. This makes it possible to easily provide the constricted portion 26, utilizing selective etching by wet etching. Thus, it is possible to balance mountability and high-speed responsiveness in a simple manner.

In addition, in the present modification example, the narrowest part of the constricted portion 26 has a diameter (constriction diameter R1) smaller than the light reception diameter R2 of the light incident surface 20A. The narrowest part of the constricted portion 26 has a depth (length) of, for example, not less than 2 μm and not more than 20 μm. This makes it possible to balance mountability and high-speed responsiveness.

In addition, in the present modification example, the insulative member (buried layer 27 or insulating film 28) that protects the constricted portion 26 is provided. This makes it possible to suppress deterioration in reliability as a result of providing the constricted portion 26.

[Modification Example D]

In any of the foregoing embodiment and modification examples thereof, the substrate 10 may include an InP substrate. In this case, the first conductive layer 21 includes, for example, n-type InGaAsP, and the second conductive layer 24 includes, for example, p-type InGaAsP. In a case where the optical absorption layer 23 is provided, the optical absorption layer 23 includes, for example, non-doped InGaAs. In this case, the constriction-formed layer 22 includes, for example, n-type InP. When using a mixed solution of phosphoric acid and hydrochloric acid as the etchant, InP has a higher etching rate than InGaAsP and InGaAs.

In the present modification example, the constriction-formed layer 22 is provided at the narrowest part of the constricted portion 26. The constriction-formed layer 22 includes a material having a relatively high etching rate compared to another part of the first conductive layer 21 except for the constricted portion 26. This makes it possible to easily provide the constricted portion 26, utilizing selective etching by wet etching. Thus, it is possible to balance mountability and high-speed responsiveness in a simple manner.

[Modification Example E]

In any of the foregoing embodiment and Modification Examples A to D, the substrate 10 may include an InP substrate. In this case, the first conductive layer 21 includes, for example, n-type InP, and the second conductive layer 24 includes, for example, p-type InP. In a case where the optical absorption layer 23 is provided, the optical absorption layer 23 includes, for example, non-doped InGaAsP. In this case, the constriction-formed layer 22 includes, for example, n-type InAlAs. When using a mixed solution of sulfuric acid, hydrogen peroxide, and water as the etchant, InAlAs has a higher etching rate than InP and InGaAs.

In the present modification example, the constriction-formed layer 22 is provided at the narrowest part of the constricted portion 26. The constriction-formed layer 22 includes a material having a relatively high etching rate compared to another part of the first conductive layer 21 except for the constricted portion 26. This makes it possible to easily provide the constricted portion 26, utilizing selective etching by wet etching. Thus, it is possible to balance mountability and high-speed responsiveness in a simple manner.

3. Second Embodiment

[Configuration]

Next, a configuration of a light receiving element 2 according to a second embodiment of the disclosure is described. FIG. 16 illustrates an example of a cross-sectional configuration of the light receiving element 2 according to the present embodiment. The light receiving element 2 is preferably applicable to an optical communication device that performs signal transmission (optical transmission) between semiconductor chips such as LSIs. The light receiving element 2 is a light receiving element of a rear surface incident type, and includes, for example, a semiconductor layer 50. The semiconductor layer 50 has a device structure in which, for example, a second conductive layer 51, an optical absorption layer 52, and a first conductive layer 53 are laminated in this order, starting from a side of a light incident surface 50A.

The second conductive layer 51 (specifically, a lower portion of the second conductive layer 51), the optical absorption layer 52, and the first conductive layer 53 constitute a mesa portion 55 having a pillar shape. For example, the pillar-shaped mesa portion 55 has a shape of a cylinder that extends in a normal direction of the light incident surface 50A. The pillar-shaped mesa portion 55 may have a side surface that is parallel to the normal direction of the light incident surface 50A, or that has a forward tapered shape or a reverse tapered shape. An upper surface of the second conductive layer 51 (a surface, of the second conductive layer 51, located on an opposite side of the optical absorption layer 52) is the light incident surface 50A through which light enters from outside. A lower surface of the mesa portion 55 includes a lower surface of the first conductive layer 53 (a surface, of the first conductive layer 53, located on an opposite side of the optical absorption layer 52).

Each of the second conductive layer 51 and the first conductive layer 53 includes a semiconductor material of a conductivity type different from each other. The second conductive layer 51 includes, for example, n-type AlGaAs. As an n-type impurity included in the n-type GaAs, silicon (Si) or selenium (Se) is given, for example. The first conductive layer 53 includes, for example, p-type AlGaAs. As the p-type impurity included in the p-type AlGaAs, zinc (Zn), magnesium (Mg), and beryllium (Be) are given.

The optical absorption layer 52 absorbs the light entering the light incident surface 50A, and converts the absorbed light into an electrical signal (photocurrent) corresponding to an output level of the absorbed light. For example, the optical absorption layer 52 includes undoped GaAs or undoped InGaAs. There is provided, in the pillar-shaped mesa portion 55 in the semiconductor layer 50, a photodiode having a PIN structure that includes the second conductive layer 51 (specifically, the lower portion of the second conductive layer 51), the optical absorption layer 52, and the first conductive layer 53. In other words, the light receiving element 2 includes a mesa-type PIN photodiode. It is to be noted that the electrical signal generated in the optical absorption layer 52 is inputted, as an optical communication signal, into an optical communication calculation circuit (not illustrated) coupled to a second electrode 61 and a first electrode 62 that are described later. The optical communication signal is used in the optical communication calculation circuit for determining a signal level of the light that has entered the light incident surface 50A.

The light receiving element 2 further includes, for example, the second electrode 61 and the first electrode 62. The second electrode 61 is electrically coupled to the second conductive layer 51 and is provided, for example, in contact with a rim of the mesa portion 55 (specifically, a flat surface of the second conductive layer 51). For example, the second electrode 61 has a configuration in which an alloy of gold (Au) and germanium (Ge), nickel (Ni), and gold (Au) are laminated in this order, starting from a side of the second conductive layer 51. The first electrode 62 is electrically coupled to the first conductive layer 53 and is provided, for example, in contact with the lower surface of the first conductive layer 53. For example, the first electrode 62 has a disc shape and covers the lower surface of the first conductive layer 53. The first electrode 62 includes, for example, titanium (Ti), platinum (Pt), and gold (Au) that are laminated in this order, starting from a side of the first conductive layer 53.

Meanwhile, the semiconductor layer 50 includes, in the vicinity of the interface 53A between the first conductive layer 53 and the optical absorption layer 52, a constricted portion 56 that is the most constricted part of the first conductive layer 53. For example, the constricted portion 56 is rotationally symmetrical with respect to a central axis of the mesa portion 55 as a rotational center (a line segment parallel to an optical axis of the light receiving element 2 and passing through a center of the mesa portion 55). The constricted portion 56 is provided along an outer edge of the mesa portion 55, avoiding at least a portion of a region opposing the light incident surface 50A. In other words, the constricted portion 56 is provided in a manner not to interrupt current path in the semiconductor layer 50.

The constricted portion 56 has a wedge shape tapering toward the central axis of the mesa portion 55, and the interface 53A has an edge exposed on the internal surface of the constricted portion 56. The interface 53A has a smaller area than the interface between the first conductive layer 53 and the second conductive layer 51 when assuming that the constricted portion 56 is not provided. The narrowest part of the constricted portion 56 has a depth (length) of, for example, not less than 2 μm and not more than 20 μm. In a case where the constricted portion 56 has a length smaller than 2 μm, an effect produced by reducing the area of the interface 53A (effect of reducing parasitic capacitance) is very small. In a case where the constricted portion 56 has a length larger than 20 μm, a current path in the semiconductor layer 50 for photoelectrons generated in the vicinity of the side surface of the mesa portion 55 within the optical absorption layer 52 is significantly larger than a current path in the semiconductor layer 50 for photoelectrons generated in the middle of the mesa portion 55 within the optical absorption layer 52. This is likely to have an adverse influence on high-speed responsiveness.

FIG. 17 is an enlarged view illustrating an example of a cross-sectional configuration in the vicinity of the constricted portion 56. The first conductive layer 53 includes a constriction-formed layer 54 at the narrowest part of the constricted portion 56. The constriction-formed layer 54 includes a material having a relatively high etching rate compared to another part of the first conductive layer 53 except for the constricted portion 56. In a case where the first conductive layer 53 includes n-type AlGaAs, the constriction-formed layer 54 includes, for example, n-type AlAs or n-type AlGaInP. When using, as the etchant, the solution in which phosphoric acid, hydrogen peroxide, and water are mixed at a ratio 3:1:50, AlAs has a higher etching rate than AlGaAs and GaAs. In addition, when using the mixed solution of hydrochloric acid and water as the etchant, AlGaInP has a higher etching rate than AlGaAs and GaAs. In a case where the first conductive layer 53 has a thickness of about 2 μm and the optical absorption layer 52 has a thickness of about 2 μm, the constriction-formed layer 54 has a thickness of not less than 10 nm and not more than 100 nm, for example, and a thickness between the interface 53A and the constriction-formed layer 54 within the first conductive layer 53 is about 100 nm, for example.

The light receiving element 2 further includes, for example, insulative members (buried layer 27 and insulating film 28) that protect the constricted portion 26. The buried layer 27 is provided to bury the constricted portion 26, and includes, for example, a resin material such as polyimide. The insulating film 28 is provided to cover a surface of the buried layer 27 and a surface of the mesa portion 25, and includes an insulative material. As the insulative material used for the insulating film 28, SiO2 and SiN are given, for example.

[Manufacturing Method]

Next, a method for manufacturing the light receiving element 2 according to the present embodiment is described. FIG. 18 illustrates an example of a manufacturing process of the light receiving element 2. FIG. 19 illustrates an example of a manufacturing process that follows FIG. 18. FIG. 20 illustrates an example of a manufacturing process that follows FIG. 19. FIG. 21 illustrates an example of a manufacturing process that follows FIG. 20.

To manufacture the light receiving element 2, for example, a compound semiconductor is collectively provided on a substrate 40 that includes GaAs, using an epitaxial crystal growth method such as the MOCVD method. At this time, for example, as a material for the compound semiconductor, methyl-based organometallic gas such as trimethylaluminum (TMAl), trimethylgallium (TMGa), trimethylindium (TMIn), and arshin (AsH3) are used. As a material for donor impurity, hydrogen selenide (H2Se) is used, for example. As a material for acceptor impurity, dimethylzinc (DMZn) is used, for example.

It is to be noted that in FIG. 18, a first conductive layer 53D includes the same material as the first conductive layer 53. A constriction-formed layer 54D includes the same material as the constriction-formed layer 54. An optical absorption layer 52D includes the same material as the optical absorption layer 52. A second conductive layer 51D includes the same material as the second conductive layer 51.

First, as illustrated in FIG. 18, for example, the second conductive layer 51D (n-type AlGaAs), the optical absorption layer 52D (non-doped GaAs), and the first conductive layer 53D (p-type AlGaAs) are provided on the substrate 40 in this order, starting from a side of the substrate 40. At the same time, the constriction-formed layer 54D (n-type AlAs or n-type AlGaInP) is provided in the first conductive layer 53D. Next, for example, a resist layer having a circular shape (not illustrated) is provided, and thereafter the semiconductor layer that includes the first conductive layer 53D, the constriction-formed layer 54D, the optical absorption layer 52D, and the second conductive layer 51D is etched into a mesa shape, using the resist layer as a mask. At this time, wet-etching is used. Here, in a case where the constriction-formed layer 54D includes n-type AlAs, the solution in which phosphoric acid, hydrogen peroxide, and water are mixed at a ratio 3:1:50 is used as the etchant. In a case where the constriction-formed layer 54D includes n-type AlGaInP, the solution in which hydrochloric acid and water is mixed is used as the etchant. Thus, as illustrated in FIG. 19, selective etching of the constriction-formed layer 54D forms, in the vicinity of the interface 21A between the first conductive layer 53 and the optical absorption layer 52 in the mesa (mesa portion 55), the constricted portion 56 that is the most constricted part of the first conductive layer 53, while exposing an edge of the interface 53A to the internal surface of the constricted portion 56. As a result, the mesa portion 55 including the constricted portion 56 in the side surface is provided.

Next, as illustrated in FIG. 20, for example, a buried layer 57 that protects the constricted portion 56 is provided. Subsequently, as illustrated in FIG. 21, for example, the insulating film 58, the first electrode 62, and the second electrode 61 are provided. Finally, for example, the substrate 40 is polished and thereby removed. In this manner, the light receiving element 2 according to the present embodiment is manufactured.

[Effects]

Next, effects of the light receiving element 2 according to the present embodiment are described.

In the present embodiment, the mesa portion 55 includes, in the vicinity of the interface 53A between the first conductive layer 53 and the optical absorption layer 52, the constricted portion 56 that is the most constricted part of the first conductive layer 53 and the interface 53A has an edge exposed on the internal surface of the constricted portion 56. This allows for a smaller parasitic capacitance of the element as compared to the case of the mesa portion 55 without the constricted portion 56. In addition, even in the case of a larger mesa diameter, it is possible to suppress an increase in the parasitic capacitance of the element. Thus, it is possible to balance mountability and high-speed responsiveness.

In addition, in the present embodiment, the constriction-formed layer 54 is provided at the narrowest part of the constricted portion 56. The constriction-formed layer 54 includes a material having a relatively high etching rate compared to another part of the first conductive layer 53 except for the constricted portion 56. This makes it possible to easily provide the constricted portion 56, utilizing selective etching by wet etching. Thus, it is possible to balance mountability and high-speed responsiveness in a simple manner.

In addition, in the present embodiment, the narrowest part of the constricted portion 56 has a depth (length) of, for example, not less than 2 μm and not more than 20 μm. This makes it possible to balance mountability and high-speed responsiveness.

In addition, in the present embodiment, the insulative member (buried layer 57 or insulating film 58) is provided that protects the constricted portion 56. This makes it possible to suppress deterioration in reliability as a result of providing the constricted portion 56.

4. Modification Examples of the Second Embodiment

Next, modification examples of the light receiving element 2 according to the second embodiment are described.

[Modification Example F]

In the second embodiment, as illustrated in FIG. 22, for example, the constriction-formed layer 54 may be omitted, and the constricted portion 56 may be provided in the vicinity of the interface 53A in the semiconductor layer 50. However, in such a case, for example, the constricted portion 56 may be provided in the following manner. For example, in the manufacturing process, a mask having an opening is provided in a region where the constricted portion 56 is to be provided in a mesa-etched side surface of the first conductive layer 53 and the optical absorption layer 52, and thereafter the constricted portion 56 is formed by selectively etching the first conductive layer 53 and the optical absorption layer 52 via the opening in the mask. In the present modification example, as with the foregoing embodiment, it is also possible to balance mountability and high-speed responsiveness.

[Modification Example G]

In the second embodiment and modification examples thereof, the constriction-formed layer 54 may include more than one layer. For example, as illustrated in FIG. 23, the constriction-formed layer 54 may be a laminate including two constriction-formed layers 54A and 54B. At this time, the constriction-formed layer 54A is provided closer to the first electrode 62, and the constriction-formed layer 54B is provided closer to the optical absorption layer 52. For the same etchant, the constriction-formed layer 54B has a higher etching rate than the constriction-formed layer 54A. Thus, when the constriction-formed layers 54A and 54B are etched using the same etchant, the constriction-formed layer 54B is etched faster than the constriction-formed layer 54A, thus the narrowest part of the constricted portion 26 is provided closer to the optical absorption layer 23 in the constriction-formed layer 54B. As a result, this makes it possible to easily provide the edge of the interface 53A at a position closer to the center of the light receiving element 2. Thus, it is not only possible to balance mountability and high-speed responsiveness, but also to easily achieve high-speed responsiveness.

[Modification Example H]

In any of the second embodiment and modification examples thereof, the optical absorption layer 52 may be omitted. At this time, for example, as illustrated in FIG. 24, there is provided, in the pillar-shaped mesa portion 55 in the semiconductor layer 50, a photodiode having a PN structure that includes the second conductive layer 51 (specifically, the lower portion of the second conductive layer 51) and the first conductive layer 53. In other words, in the present modification example, the light receiving element 2 includes a mesa-type PN photodiode.

In the present modification example, the semiconductor layer 50 includes, in the vicinity of the interface 53A between the first conductive layer 53 and the second conductive layer 51, the constricted portion 56 that is the most constricted part of the first conductive layer 53. The constricted portion 56 has a wedge shape tapering toward the central axis of the mesa portion 55, and the interface 53A has an edge exposed on the internal surface of the constricted portion 56. The interface 53A has a smaller area than the interface between the first conductive layer 53 and the second conductive layer 51 when assuming that the constricted portion 56 is not provided. The narrowest part of the constricted portion 56 has a depth (length) of, for example, not less than 2 μm and not more than 20 μm. In a case where the constricted portion 56 has a length smaller than 2 μm, an effect produced by reducing the area of the interface 53A is very small. In a case where the constricted portion 56 has a length larger than 20 μm, within a depletion region that is provided in a region including the interface 53A between the first conductive layer 53 and the second conductive layer 51, a current path in the semiconductor layer 50 for photoelectrons generated in the vicinity of the side surface of the mesa portion 55 is significantly longer than a current path in the semiconductor layer 50 for photoelectrons generated in the middle of the mesa portion 55 within the depletion region. This is likely to have an adverse influence on high-speed responsiveness. It is to be noted that the method for manufacturing the light receiving element 2 according to the present modification example conforms to the method for manufacturing the light receiving element 1 according to the foregoing Modification Example C.

In the present modification example, as with the foregoing second embodiment, there is provided, in the vicinity of the interface 53A between the first conductive layer 53 and the second conductive layer 51, the constricted portion 56 that is the most constricted part of the first conductive layer 53. This makes it possible to balance mountability and high-speed responsiveness.

In addition, in the present modification example, the constriction-formed layer 54 is provided at the narrowest part of the constricted portion 56. The constriction-formed layer 54 includes a material having a relatively high etching rate compared to another part of the first conductive layer 53 except for the constricted portion 56. This makes it possible to easily provide the constricted portion 56, utilizing selective etching by wet etching. Thus, it is possible to balance mountability and high-speed responsiveness in a simple manner.

In addition, in the present modification example, the narrowest part of the constricted portion 56 has a depth (length) of, for example, not less than 2 μm and not more than 20 μm. This makes it possible to balance mountability and high-speed responsiveness.

In addition, in the present modification example, the insulative member (buried layer 57 or insulating film 58) is provided that protects the constricted portion 56. This makes it possible to suppress deterioration in reliability as a result of providing the constricted portion 56.

[Modification Example I]

In any of the second embodiment and modification examples thereof, the substrate 40 may include an InP substrate. In this case, the second conductive layer 51 includes, for example, n-type InGaAsP, and the first conductive layer 53 includes, for example, p-type InGaAsP. In a case where the optical absorption layer 52 is provided, the optical absorption layer 52 includes, for example, non-doped InGaAs. In this case, the constriction-formed layer 54 includes, for example, n-type InP. When using the mixed solution of phosphoric acid and hydrochloric acid as the etchant, InP has a higher etching rate than InGaAsP and GaAsP.

In the present modification example, the constriction-formed layer 54 is provided at the narrowest part of the constricted portion 56. The constriction-formed layer 54 includes a material having a relatively high etching rate compared to another part of the first conductive layer 53 except for the constricted portion 56. This makes it possible to easily provide the constricted portion 56, utilizing selective etching by wet etching. Thus, it is possible to balance mountability and high-speed responsiveness in a simple manner.

[Modification Example J]

In any of the second embodiment and Modification Examples F to H, the substrate 40 may include an InP substrate. In this case, the second conductive layer 51 includes, for example, n-type InP, and the first conductive layer 53 includes, for example, p-type InP. In a case where the optical absorption layer 52 is provided, the optical absorption layer 52 includes, for example, non-doped InGaAsP. In this case, the constriction-formed layer 54 includes, for example, n-type InAlAs. When using the mixed solution of sulfuric acid, hydrogen peroxide, and water as the etchant, InAlAs has a higher etching rate than InP and InGaAsP.

In the present modification example, the constriction-formed layer 54 is provided at the narrowest part of the constricted portion 56. The constriction-formed layer 54 includes a material having a relatively high etching rate compared to another part of the first conductive layer 53 except for the constricted portion 56. This makes it possible to easily provide the constricted portion 56, utilizing selective etching by wet etching. Thus, it is possible to balance mountability and high-speed responsiveness in a simple manner.

5. Third Embodiment

[Configuration]

Next, an optical communication device 3 according to a third embodiment of the disclosure is described. FIG. 25 illustrates an example of a cross-sectional configuration of the optical communication device 3 according to the present embodiment. The optical communication device 3 includes two LSI chips 72 and 73 mounted on a printed wiring board 71. On a surface of one of the LSI chips, i.e, the LSI chip 72, a light emitting element 74 such as a semiconductor laser is provided. The light emitting element 74 converts an electrical signal from the LSI chip 72 into an optical signal, and outputs the optical signal. On a surface of the other LSI chip 73, the light receiving elements 1 and 2 according to any of the foregoing embodiments and modification examples thereof are provided. Each of the light receiving elements 1 and 2 converts, into an electrical signal, the optical signal inputted into each of the light receiving elements 1 and 2, and inputs the electrical signal into the LSI chip 73.

A lens 75 is provided on a light emitting surface of the light emitting element 74, each of the light incident surfaces 20A and 50A of the respective light receiving elements 1 and 2, and each end of an optical waveguide 78. For example, this lens 75 is a collimating lens that collimates divergent light and converges parallel light. In addition, there is provided, on an upper surface of each of the LSI chips 72 and 73, a male connector 76 having a cylindrical shape and covering the light emitting element 74 and the light receiving elements 1 and 2. An upper surface of the male connector 76 has an opening 76A, with a female connector 77 being provided to cover this opening 76A while being fitted in the male connector 76. This female connector 77 is provided along the optical waveguide 78 and also serves to support the optical waveguide 78.

In the present embodiment, when the light emitting element 74 is driven after the male connector 76 and the female connector 77 are coupled to each other, the light emitting element 74 emits light, and the light enters an end of the optical waveguide 78 via the lens 75. The light that has entered the optical waveguide 78 is guided through the optical waveguide 78 to be outputted from another end of the optical waveguide 78, and enters the light receiving elements 1 and 2 via the lens 75. The light that has entered the light receiving elements 1 and 2 is converted into an electrical signal (photocurrent) corresponding to an output level of the entered light, and then the electrical signal is outputted to the LSI chip 73.

Meanwhile, in the present embodiment, the light receiving elements 1 and 2 according to any of the foregoing embodiments and modification examples thereof are used in the optical communication device 3. This facilitates mounting of the light receiving elements 1 and 2, thus making it possible to manufacture the optical communication device 3 at low cost. In addition, each of the light receiving elements 1 and 2 has high-speed responsiveness, thus making it possible to perform optical communication at high speed.

In the foregoing third embodiment, the optical communication device 3 may include more than one light emitting element 74. In addition, in the foregoing third embodiment, the optical communication device 3 may include more than one light emitting element 74. The first optical communication device according to an embodiment of the disclosure may include more than one light receiving element 1 or more than one light receiving element 2.

Although the disclosure has been described above referring to some embodiments and modification examples thereof, the disclosure is not limited to any of the embodiments, and may be modified in a variety of ways. It is to be noted that effects described herein are merely illustrative. Effects described herein are not limited by the effects described herein. Effects described herein may have other effects than the effects described herein.

In addition, for example, the disclosure may have the following configurations.

(1)
A light receiving element including a semiconductor layer in which a photodiode is provided in a mesa portion having a pillar shape, the photodiode having a PIN structure that includes a first conductive layer, an optical absorption layer, and a second conductive layer having a light incident surface,
the semiconductor layer including, in a vicinity of an interface between the first conductive layer and the optical absorption layer, a constricted portion that is a most constricted part of the first conductive layer,
the interface having an edge exposed on an internal surface of the constricted portion.

(2)
The light receiving element according to (1), in which
the first conductive layer includes a constriction-formed layer at a narrowest part of the constricted portion, the constriction-formed layer including a material having a relatively high etching rate compared to another part of the first conductive layer except for the constricted portion.

(3)
The light receiving element according to (1) or (2), in which
the narrowest part of the constricted portion has a diameter smaller than a light reception diameter of the light incident surface.

(4)
The light receiving element according to any one of (1) to (3), in which
the narrowest part of the constricted portion has a depth of not less than 2 μm and not more than 20 μm.

(5)
The light receiving element according to any one of (1) to (4), further including an insulative member that protects the constricted portion.

(6)
A light receiving element including a semiconductor layer in which a photodiode is provided in a mesa portion having a pillar shape, the photodiode having a PN structure that includes a first conductive layer and a second conductive layer having a light incident surface,
the semiconductor layer including, in a vicinity of an interface between the first conductive layer and the second conductive layer, a constricted portion that is a most constricted part of the first conductive layer,
the interface having an edge exposed on an internal surface of the constricted portion.

(7)
The light receiving element according to (6), in which
the first conductive layer includes a constriction-formed layer at a narrowest part of the constricted portion, the constriction-formed layer including a material having a relatively high etching rate compared to another part of the first conductive layer except for the constricted portion.

(8)
The light receiving element according to (6) or (7), in which
the narrowest part of the constricted portion has a diameter smaller than a light reception diameter of the light incident surface.

(9)
The light receiving element according to any one of (6) to (8), in which
the narrowest part of the constricted portion has a depth of not less than 2 μm and not more than 20 μm.

(10)
The light receiving element according to any one of (6) to (9), further including an insulative member that protects the constricted portion.

(11)
An optical communication device including one or more light receiving elements,
the one or more light receiving elements each including a semiconductor layer in which a photodiode is provided in a mesa portion having a pillar shape, the photodiode having a PIN structure that includes a first conductive layer, an optical absorption layer, and a second conductive layer having a light incident surface,
the semiconductor layer including, in a vicinity of an interface between the first conductive layer and the optical absorption layer, a constricted portion that is a most constricted part of the first conductive layer,
the interface having an edge exposed on an internal surface of the constricted portion.

(12)
An optical communication device including one or more light receiving elements,
the one or more light receiving elements each including a semiconductor layer in which a photodiode is provided in a mesa portion having a pillar shape, the photodiode having a PN structure that includes a first conductive layer and a second conductive layer having a light incident surface,
the semiconductor layer including, in a vicinity of an interface between the first conductive layer and the second conductive layer, a constricted portion that is a most constricted part of the first conductive layer,
the interface having an edge exposed on an internal surface of the constricted portion.

(13)
A method for manufacturing a light receiving element, the method including an etching process that includes:

etching a semiconductor layer into a shape of a mesa, the
semiconductor layer including a photodiode having a PIN
structure that includes a first conductive layer, an optical
absorption layer, and a second conductive layer;
providing, in a vicinity of an interface between the first
conductive layer and the optical absorption layer in the
mesa, a constricted portion that is a most constricted part
of the first conductive layer; and
exposing an edge of the interface to an internal surface of the
constricted portion.

(14)
The method for manufacturing a light receiving element
according to (13), in which
the first conductive layer includes a constriction-formed
layer in the vicinity of the interface in the first conductive
layer, the constriction-formed layer including a material
having a relatively high etching rate compared to another
part of the first conductive layer except for the constricted
portion, and
the constricted portion is formed by selectively etching the
constriction-formed layer in the etching process.

(15)
A method for manufacturing a light receiving element, the
method including an etching process that includes:
etching a semiconductor layer into a shape of a mesa, the
semiconductor layer including a photodiode, the photodiode having a PN structure that includes a first conductive layer and a second conductive layer;
providing, in a vicinity of an interface between the first
conductive layer and the second conductive layer in the
mesa, a constricted portion that is a most constricted part
of the first conductive layer; and
exposing an edge of an interface to the internal surface of the
constricted portion.

(16)
The method for manufacturing a light receiving element
according to (15), in which
the first conductive layer includes a constriction-formed
layer in the vicinity of the interface in the first conductive
layer, the constriction-formed layer including a material
having a relatively high etching rate compared to another
part of the first conductive layer except for the constricted
portion, and
the constricted portion is formed by selectively etching the
constriction-formed layer in the etching process.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

The invention claimed is:

1. A light receiving element comprising a semiconductor layer in which a photodiode is provided in a mesa portion having a pillar shape, the photodiode having a PIN structure that includes a first conductive layer, an optical absorption layer, and a second conductive layer having a light incident surface,
the semiconductor layer including, in a vicinity of an interface between the first conductive layer and the optical absorption layer, a constricted portion that is a most constricted part of the first conductive layer,
the interface having an edge exposed on an internal surface of the constricted portion,
wherein a narrowest part of the constricted portion has a depth from 2 μm to 20 μm.

2. The light receiving element according to claim 1, wherein
the first conductive layer includes a constriction-formed layer at a narrowest part of the constricted portion, the constriction-formed layer including a material having a relatively high etching rate compared to another part of the first conductive layer except for the constricted portion.

3. The light receiving element according to claim 1, wherein
the narrowest part of the constricted portion has a diameter smaller than a light reception diameter of the light incident surface.

4. The light receiving element according to claim 1, further comprising an insulative member that protects the constricted portion.

5. A light receiving element comprising a semiconductor layer in which a photodiode is provided in a mesa portion having a pillar shape, the photodiode having a PN structure that includes a first conductive layer and a second conductive layer having a light incident surface,
the semiconductor layer including, in a vicinity of an interface between the first conductive layer and the second conductive layer, a constricted portion that is a most constricted part of the first conductive layer,
the interface having an edge exposed on an internal surface of the constricted portion,
wherein a narrowest part of the constricted portion has a depth from 2 μm to 20 μm.

6. The light receiving element according to claim 5, wherein
the first conductive layer includes a constriction-formed layer at a narrowest part of the constricted portion, the constriction-formed layer including a material having a relatively high etching rate compared to another part of the first conductive layer except for the constricted portion.

7. The light receiving element according to claim 5, wherein
the narrowest part of the constricted portion has a diameter smaller than a light reception diameter of the light incident surface.

8. The light receiving element according to claim 5, further comprising an insulative member that protects the constricted portion.

9. An optical communication device comprising one or more light receiving elements,
the one or more light receiving elements each including a semiconductor layer in which a photodiode is provided in a mesa portion having a pillar shape, the photodiode having a PIN structure that includes a first conductive layer, an optical absorption layer, and a second conductive layer having a light incident surface,
the semiconductor layer including, in a vicinity of an interface between the first conductive layer and the optical absorption layer, a constricted portion that is a most constricted part of the first conductive layer,
the interface having an edge exposed on an internal surface of the constricted portion,
wherein a narrowest part of the constricted portion has a depth from 2 μm to 20 μm.

10. An optical communication device comprising one or more light receiving elements,
the one or more light receiving elements each including a semiconductor layer in which a photodiode is provided in a mesa portion having a pillar shape, the photodiode having a PN structure that includes a first conductive layer and a second conductive layer having a light incident surface, the semiconductor layer including, in a vicinity of an interface between the first conductive layer and the second conductive layer, a constricted portion that is a most constricted part of the first conductive layer, the interface having an edge exposed on an internal surface of the constricted portion, wherein a narrowest part of the constricted portion has a depth from 2 µm to 20 µm.

11. A method for manufacturing a light receiving element, the method comprising an etching process that includes:

etching a semiconductor layer into a shape of a mesa, the semiconductor layer including a photodiode having a PIN structure that includes a first conductive layer, an optical absorption layer, and a second conductive layer;

providing, in a vicinity of an interface between the first conductive layer and the optical absorption layer in the mesa, a constricted portion that is a most constricted part of the first conductive layer; and exposing an edge of the interface to an internal surface of the constricted portion, wherein a narrowest part of the constricted portion has a depth from 2 µm to 20 µm.

12. The method for manufacturing a light receiving element according to claim 11, wherein, the first conductive layer includes a constriction-formed layer in the vicinity of the interface in the first conductive layer, the constriction-formed layer including a material having a relatively high etching rate compared to another part of the first conductive layer except for the constricted portion, and the constricted portion is formed by selectively etching the constriction-formed layer in the etching process.

13. A method for manufacturing a light receiving element, the method comprising an etching process that includes:

etching a semiconductor layer into a shape of a mesa, the semiconductor layer including a photodiode, the photodiode having a PN structure that includes a first conductive layer and a second conductive layer;

providing, in a vicinity of an interface between the first conductive layer and the second conductive layer in the mesa, a constricted portion that is a most constricted part of the first conductive layer; and exposing an edge of the interface to an internal surface of the constricted portion, wherein a narrowest part of the constricted portion has a depth from 2 µm to 20 µm.

14. The method for manufacturing a light receiving element according to claim 13, wherein the first conductive layer includes a constriction-formed layer in the vicinity of the interface in the first conductive layer, the constriction-formed layer including a material having a relatively high etching rate compared to another part of the first conductive layer except for the constricted portion, and the constricted portion is formed by selectively etching the constriction-formed layer in the etching process.

* * * * *